(12) United States Patent
Hoffmann

(10) Patent No.: US 10,840,860 B2
(45) Date of Patent: Nov. 17, 2020

(54) DEVICE FOR CONTROLLING A SELF-CONDUCTING N-CHANNEL OUTPUT STAGE FIELD EFFECT TRANSISTOR

(71) Applicant: FORSCHUNGSVERBUND BERLIN E.V., Berlin (DE)

(72) Inventor: Thomas Hoffmann, Berlin (DE)

(73) Assignee: FORSCHUNGSVERBUND BERLIN E.V., Berlin (DE)

( * ) Notice: Subject to any disclaimer, the term of this patent is extended or adjusted under 35 U.S.C. 154(b) by 0 days.

(21) Appl. No.: 16/498,990

(22) PCT Filed: Mar. 13, 2018

(86) PCT No.: PCT/EP2018/056165
§ 371 (c)(1),
(2) Date: Sep. 27, 2019

(87) PCT Pub. No.: WO2018/197096
PCT Pub. Date: Nov. 1, 2018

(65) Prior Publication Data
US 2020/0059209 A1 Feb. 20, 2020

(30) Foreign Application Priority Data
Apr. 25, 2017 (DE) .......................... 10 2017 108 828

(51) Int. Cl.
*H03F 3/217* (2006.01)
*H03F 1/02* (2006.01)
(Continued)

(52) U.S. Cl.
CPC ......... *H03F 3/2171* (2013.01); *H03F 1/0205* (2013.01); *H03K 17/06* (2013.01); *H03K 2017/066* (2013.01)

(58) Field of Classification Search
USPC ........................ 330/277, 310, 10, 251, 207 A
See application file for complete search history.

(56) References Cited

U.S. PATENT DOCUMENTS 4,238,737 A 12/1980 Yokoyama
6,057,726 A 5/2000 Hitoshi
(Continued)

FOREIGN PATENT DOCUMENTS

EP 2858239 4/2015

OTHER PUBLICATIONS

"Metall-Oxid-halbleiter-Feldeffekttransistor", Wikipedia, Jan. 31, 2017.
(Continued)

*Primary Examiner* — Hieu P Nguyen
(74) *Attorney, Agent, or Firm* — Fox Rothschild LLP

(57) ABSTRACT

A device (100) for driving a self-conducting n-channel output stage field effect transistor (V1) comprising a control signal input (110), a control signal output (120) for connection to a gate electrode (V1G) of the output stage field effect transistor (V1), a first node (N1) connected to the control signal output (120), a second node (N2), and a first transistor (V4). A source electrode (V4S) of the first transistor (V4) is connected to the first node (N1), a gate electrode (V4G) of the first transistor (V4) is connected to the second node (N2) and a drain electrode (V4D) of the first transistor (V4) is either connected to the source electrode of the output field effect transistor (V1) or connected to a supply voltage (+Vdd). A resistor (R1) is connected with one end to the second node (N2). The device (100) is characterized in that the resistor (R1) is connected at the other end to the first node (N1).

Figure 1:
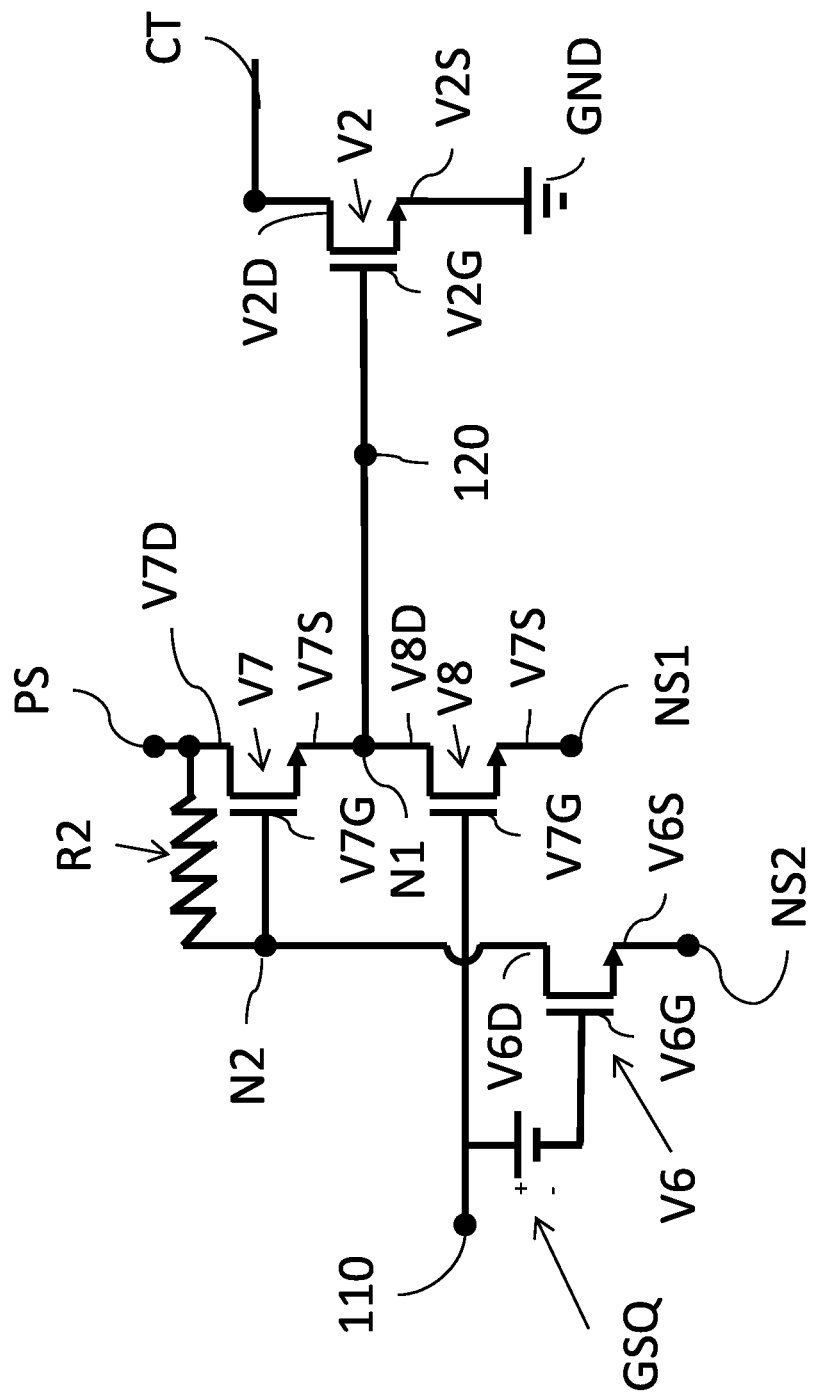

The first transistor (V4) can be used to cause the supply voltage (Vdd) to be applied to the control signal output when a low-level signal is applied to the control signal input (110).

8 Claims, 2 Drawing Sheets

(51) Int. Cl.
*H03K 17/06* (2006.01)
*H03F 3/20* (2006.01)

(56) References Cited

U.S. PATENT DOCUMENTS

| | | | |
|---|---|---|---|
| 9,806,678 B2 * | 10/2017 | Diduck | H03F 1/0205 |
| 2012/0025914 A1 | 2/2012 | Suk et al. | |
| 2016/0373063 A1 * | 12/2016 | Khandavalli | H03F 1/0227 |
| 2016/0380600 A1 | 12/2016 | Diduck | |
| 2020/0119694 A1 * | 4/2020 | Kurusu | H03F 3/213 |

OTHER PUBLICATIONS

International Search Report dated Jun. 19, 2018 in PCT/EP2018/056165.

* cited by examiner

Fig. 1 – Prior Art

DEVICE FOR CONTROLLING A SELF-CONDUCTING N-CHANNEL OUTPUT STAGE FIELD EFFECT TRANSISTOR

CROSS-REFERENCE TO RELATED APPLICATIONS

This application is a § 371 national stage entry of International Application No. PCT/EP2018/056165, filed Mar. 13, 2018, which claims priority to and the benefit of German Application No. 102017108828.8, filed Apr. 25, 2017, both of which are hereby incorporated herein by reference in their entireties.

The present invention concerns a device for driving a self-conducting n-channel output stage field effect transistor and a device for electronically amplifying an alternating voltage in push-pull circuit.

Self-conducting n-channel output stage field effect transistors, hereinafter referred to as output stage transistors, are used as power transistors, for example, in voltage-switched class S microwave power amplifiers and are driven by drivers.

A driver may be formed as a device comprising a control signal input, a control signal output for connection to a gate electrode of the output stage field effect transistor, a negative voltage source and a positive voltage source. A source electrode of a transistor is connected to the first node, a gate electrode of the driver transistor is electrically connected to the second node, hereinafter referred to as connected, and a drain electrode of the driver transistor is connected to the positive voltage source. A resistor is connected with one end to the second node. The other end of the resistor is connected to the positive voltage source.

When the driver transistor is used in a driver that drives a high-side output stage transistor, a voltage at the source electrode of the driver transistor can resonate with an output voltage.

In order to reliably inhibit the driver transistor by means of a negative voltage at the gate electrode of the output stage transistor, the voltage between the gate and source electrode of the driver transistor must be sufficiently negative. In this state, there is a high voltage across the resistor and this leads to a power loss in the driver. U.S. Pat. No. 4,238,737 therefore deals with the balancing of push-pull amplifiers.

Invention

According to the invention, a device according to claim 1 for driving a self-conducting n-channel output stage field effect transistor is presented. Furthermore, a device according to claim 6 for the electronic amplification of an alternating voltage in push-pull circuit is presented.

The device comprises a control signal input, a control signal output for connection to a gate electrode of the output stage field effect transistor, a first node connected to the control signal output, a second node, and a first driver transistor. A source electrode of the first driver transistor is connected to the first node, a gate electrode of the first driver transistor is connected to the second node, and a drain electrode of the first driver transistor is connected or connectable to a supply voltage. A resistor is connected with one end to the second node. The device is characterized in that the resistor is connected with the other end to the first node.

With the help of the first driver transistor, the supply voltage can be applied to the control signal output when a low-level signal is applied to the control signal input.

By applying a negative voltage to the second node opposite the first node, the first driver transistor is inhibited. Since the other end of the resistor is connected to the first node, the voltage drop across the resistor and thus the power dissipation of the driver is determined by the voltage at the control signal output. This voltage is, at least if the first driver transistor inhibits, lower than the voltage of the positive voltage source, so that the driver has a lower power dissipation on average.

The device comprises a first negative voltage source providing a first voltage, and a second driver transistor. A source electrode of the second driver transistor is connected to the first negative voltage source, a gate electrode of the second driver transistor is connected to the signal input, and a drain electrode of the second driver transistor is connected to the first node.

The voltage of the negative voltage source determines the voltage at the control signal output when the first driver transistor inhibits and the second driver transistor conducts.

The device may also include a second negative voltage source and a third driver transistor. A source electrode of the third driver transistor can be connected to the second negative voltage source, which provides a second voltage. A drain electrode of the third transistor can be connected to the second node.

The third driver transistor can be used to cause the first driver transistor to reliably inhibit when a high-level signal is present at the signal input. The resistor can be used to cause the first driver transistor to conduct when a low-level signal is present at the signal input. In particular, a resistance value of the resistor and a voltage difference between the first negative voltage and the second negative voltage can be selected in such a way that a voltage drop across the resistor causes the first transistor to inhibit reliably and a power dissipation at the resistor is as low as possible.

The device may include a DC voltage source. A gate electrode of the third driver transistor can be connected to a negative side of the DC voltage source and a positive side of the DC voltage source can be connected to the control signal input.

By applying a DC voltage to the gate of the third driver transistor, the third driver transistor can reliably switch the second negative voltage to the second node when the high-level signal is applied to the signal input.

The first driver transistor can be a self-conducting field effect transistor.

The device further presented comprises at least one self-conductive n-channel output stage field effect transistor having a source electrode whose potential resonates with an output voltage of the device, and a device for driving the self-conductive n-channel output stage field effect transistor according to one of the preceding claims.

The device further presented may include a fifth voltage source providing a positive supply voltage, wherein a drain electrode of the self-conducting n-channel output stage transistor may be connected to the fifth voltage source and the supply voltage may be at least one order of magnitude greater than a voltage difference between the first negative voltage and the second negative voltage.

An integrated circuit may include the device further presented.

The device and/or integrated circuit presented below can be used in a class S voltage switched microwave power amplifier.

Advantageous further embodiments of the invention are disclosed in the subclaims and described in the description.

DRAWINGS

Figure 2:
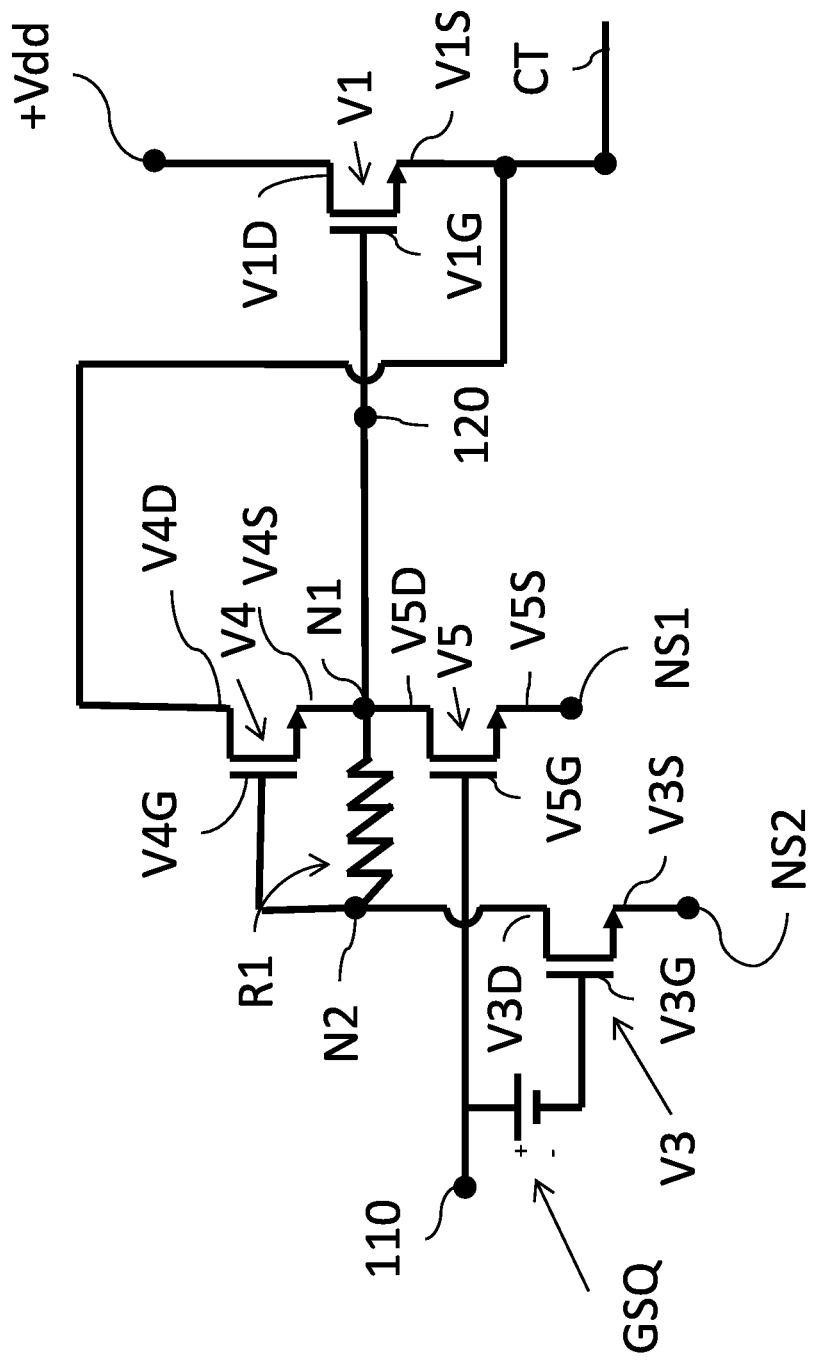

Examples of the invention are explained in more detail in the drawings and the following description. Show it:

FIG. 1 provides a prior art device for driving a low-side driver transistor, and FIG. 2 shows an example of the present invention for driving a high-side driver transistor.

EXAMPLE EMBODIMENT

FIG. 1 shows a device for driving a self-conducting n-channel low-side output stage field effect transistor V2 according to the prior art.

The device comprises a first driver transistor V7, a control signal input 110 and a control signal output 120. The control signal output 120 is connected to a gate electrode of the self-conducting n-channel output stage field effect transistor V2 or is configured to be connected to such a gate electrode. The drain electrode of the self-conducting n-channel low-side output stage field effect transistor V2 is connected to the output CT and the source electrode of the self-conducting n-channel low-side output stage field effect transistor V2 is connected to ground GND.

The control signal output 120 is connected to a first node N1. The first node N1 is connected to a source electrode V7S of the first driver transistor V7. A drain electrode V7D of the first driver transistor V7 is connected to a positive voltage source PS. A gate electrode V7G of the first driver transistor V7 is connected to a second node N2. The control signal input 110 is connected to a gate electrode V8G of a second driver transistor V8. A drain electrode V8D of the second driver transistor V8 is connected to the first node N1. The control signal input 110 is further connected to a positive side of a DC voltage source GSQ. A negative side of the DC voltage source GSQ is connected to a gate electrode V6G of a third driver transistor V6. A drain electrode V6D of the third driver transistor V6 is connected to the second node N2.

A source electrode V8S of the second driver transistor V8 is connected to a first negative voltage source NS1, which provides a first negative voltage −Ve. A source electrode V6S of the third driver transistor V6 is connected to a second negative voltage source NS2 which provides a second negative voltage −Vee which is lower than the first negative voltage −Ve.

A resistor R2 connected to the positive voltage source PS and the second node N2 is arranged between the positive voltage source PS and the second node N2.

The power dissipation required to inhibit V7 and thus V2 is determined by the current strength of the current flowing through the resistor R2, which in turn depends on:

$$PVer = (VPS - Vee)^2 / R2$$

Since the voltage difference VPS−Vee of power amplifiers is at least one order of magnitude smaller than the supply voltage of the power amplifier +Vdd, the power dissipation of the resistor PVer is relatively low.

When used as a high-side driver, the drain of V2 is connected to the supply voltage of the power amplifier +Vdd, while Source of V2 is connected to CT. For the driver to function correctly, VPS must be at least as high as the supply voltage of the +Vdd power amplifier. This considerably increases the power dissipation of R2.

FIG. 2 shows a device 100 for driving a self-conducting n-channel high-side output stage effect transistor V1 according to an execution example of the invention, which among other things has less power dissipation.

In contrast to the device shown in FIG. 1, the source electrode of the self-conducting n-channel high-side output stage effect transistor V1 is connected to the output CT, the drain electrode of the self-conducting n-channel high-side output stage effect transistor V1 is connected to a positive voltage source +Vdd. Furthermore, the resistor R1 is arranged between the first and the second node N1, N2.

The device 100 shown in FIG. 2 comprises a first driver transistor V4, a control signal input 110 and a control signal output 120. The control signal output 120 is connected to a gate electrode V1G of the self-conducting n-channel output stage field effect transistor V1 or is configured to be connected to such a gate electrode V1G.

The control signal output 120 is connected to a first node N1. The first node N1 is connected to a source electrode V4S of the first driver transistor V4. A gate electrode V4G of the first driver transistor V4 is connected to a second node N2. The control signal input 110 is connected to a gate electrode V5G of a second driver transistor V5. A drain electrode V5D of the second driver transistor V5 is connected to the first node N1. The control signal input 110 is further connected to a positive side of a DC voltage source GSQ. A negative side of the DC voltage source GSQ is connected to a gate electrode V3G of a third driver transistor V3. A drain electrode V3D of the third driver transistor V3 is connected to the second node N2.

A source electrode V5S of the second driver transistor V5 is connected to a first negative voltage source NS1, which provides a first negative voltage. A source electrode V3S of the third driver transistor V3 is connected to a second negative voltage source NS2, which provides a second negative voltage that is lower than the first negative voltage. A resistor R1 connected to the nodes N1, N2 is arranged between the first and second nodes N1, N2.

A drain electrode V4D of the first driver transistor V4 is connected to a positive voltage source, or to a source electrode V1S of the self-conducting n-channel output stage field effect transistor V1, or is configured for connection.

In an advantageous exemplary form of the invention, the first transistor V4 is a self-conducting field-effect transistor.

Another example of the invention is a device for the electronic amplification of an alternating voltage in a push-pull circuit. The device comprises at least one self-conducting n-channel output stage field effect transistor V1 to a source electrode V1S whose potential oscillates to an output voltage of the device. For driving the self-conducting n-channel output stage field effect transistor V1, the device comprises the device shown in FIG. 2 for driving the n-channel high-side output stage field effect transistor V1.

The supply voltage +Vdd, with which the output stage field effect transistor V1 is supplied, is for example at least one order of magnitude larger than a voltage difference between the first negative voltage and the second negative voltage.

The drain electrode of the first driver transistor V4 can be connected to the drain electrode of the self-conducting n-channel output stage field effect transistor or to its source electrode.

Further examples of the invention include the device for electronic amplification and/or the device for driving a self-conducting n-channel high-side output stage field effect transistor implemented as an integrated circuit.

Finally, in an execution example of the present invention, the electronic amplification device and/or the device for driving a self-conducting n-channel high-side output stage field effect transistor are used in a voltage switched class S microwave power amplifier.

In one example, the invention concerns a device for low-loss control of power transistors in electronic AC amplifier stages in a push-pull circuit, these amplifiers having at least one self-conducting n-channel FET as driver transistor, the source of which is not at constant potential but resonates with the output voltage of the amplifier, which is also referred to as floating potential.

Preferably, the inventive device can be used as a "high-side driver" in voltage switched Class S microwave power amplifiers.

The function of the device according to the invention when used as a high-side driver for a Class S voltage-switched microwave power amplifier is hereinafter described in FIG. 2.

The output stage FET V1 is controlled by the high-side driver, consisting of V3, V4, V5 and R1. The output voltage is tapped at the source electrode of the driver transistor (hereinafter referred to as transistor) V1. The control voltage of the high-side driver, which is applied to the gate electrode V5G, is applied to the control signal output 120. The control voltage is also supplied with a DC bias and applied to the gate electrode V3G of the transistor V3.

Unless otherwise stated, the voltages listed below refer to ground or the potential of the source electrode V2S.

Case I: V1 Should be Conductive

A low level is applied to the control signal input. This causes the transistors V3 and V5 to inhibit. Therefore no current can flow through the resistor R1, which would be necessary to inhibit the self-conducting transistor V4 of the execution example. Transistor V4 is therefore conductive.

Since the channel of V4 (drain-source voltage) is parallel to the input (gate source voltage) of V1, transistor V4, when conductive, causes the voltage difference between the gate and source electrode of the self-conducting transistor V1 to be zero. Transistor V1 is then also conductive.

Case II: V1 Should Inhibit

A high level is applied to the control signal input 110. This causes the transistors V3 and V5 to conduct. The voltage −Ve is then applied at node N1. This voltage −Ve is also applied to the gate electrode of the transistor V1. At node N2 the voltage −Vee is applied, which is lower than −Ve. There is therefore a voltage difference between the nodes N1 and N2. Therefore, current flows through the resistor R1, which is necessary to inhibit the self-conducting transistor V4 of the execution example. Transistor V4 thus inhibits. The voltage at the source electrode V1S is never negative, while at the gate electrode V1G the negative voltage −Ve is applied, so that there is a voltage drop between source and gate electrode. This causes V1 to inhibit.

The power dissipation required for inhibiting is determined by the current strength of the current flowing through resistor R1:

$$PVer=(-Ve-Vee)^2/R1$$

In particular, the power dissipation is independent of a supply voltage supplied to the self-conducting n-channel output stage field effect transistor V1.

In further exemplary embodiments of the invention, the driver is DC-coupled and contains no reactive elements. Then the driver works independently of carrier frequency and duty cycle.

In a further exemplary embodiment, the invention is realized as an integrated circuit.

The invention claimed is:

1. A device for electronically amplifying an alternating voltage in push-pull circuit comprising:
   at least one self-conducting n-channel output stage field effect transistor with a source electrode, the potential of which oscillates with an output voltage of the device, and a device for driving the self-conducting n-channel output stage field effect transistor comprising:
   a control signal input,
   a control signal output for connection to a gate electrode of said output stage field effect transistor,
   a first node connected to the control signal output,
   a second node,
   a first transistor,
   wherein a source electrode of said first transistor is connected to said first node, a gate electrode of said first transistor is connected to said second node, and a drain electrode of said first transistor is connected or connectable to a positive supply voltage, and
   a resistor connected with one end to said second node, characterized in that wherein said resistor is connected with the other end to said first node, further comprising:
   a first negative voltage source providing a first voltage,
   a second transistor,
   wherein a source electrode of said second transistor is connected to said first negative voltage source, a gate electrode of said second transistor is connected to said control signal input, and a drain electrode of said second transistor is connected to said first node.

2. The device of claim 1, further comprising:
   a third transistor,
   a second negative voltage source providing a second voltage,
   wherein a source electrode of said third transistor is connected to said second negative voltage source and a drain electrode of said third transistor is connected to said second node.

3. The device of claim 2, further comprising:
   a DC voltage source, wherein a positive side of the DC voltage source is connected to the control signal input and a negative side of the DC voltage source is connected to a gate electrode of the third transistor.

4. The device of claim 1 wherein the first transistor is a self-conducting field effect transistor.

5. The device of claim 1, wherein the device comprises a third voltage source providing the supply voltage, wherein a drain electrode of the self-conductive n-channel output stage field effect transistor is connected to said third voltage source and said third voltage is at least one order of magnitude greater than a voltage difference between said first voltage and said second voltage.

6. The device of claim 1, wherein the source electrode of the first transistor is connected to the drain source electrode of the self-conducting n-channel output stage field effect transistor.

7. An integrated circuit, wherein the circuit comprises a device according to claim 1.

8. A class S voltage switched microwave power amplifier, comprising the device of claim 1.

* * * * *